Aug. 27, 1963 H. L. HENNEKE 3,101,523

METHOD FOR ATTACHING LEADS TO SMALL SEMICONDUCTOR SURFACES

Filed March 8, 1960

INVENTOR

Harry L. Henneke

BY Stevens, Davis, Miller & Mosher

ATTORNEYS

United States Patent Office
3,101,523
Patented Aug. 27, 1963

3,101,523

METHOD FOR ATTACHING LEADS TO SMALL SEMICONDUCTOR SURFACES

Harry L. Henneke, Garland, Tex., assignor to Texas Instruments Incorporated, Dallas, Tex., a corporation of Delaware Filed Mar. 8, 1960, Ser. No. 13,501
10 Claims. (Cl. 29—25.3)

This invention relates to electronic devices and methods for making them. Although the principles underlying the invention may find utility in a variety of expressions, the particular embodiments herein selected for illustrative description relate to etched semiconductor elements and the methods for fabricating them.

As the sizes of electronic devices have decreased, the problems encountered in making suitable electrical connections to them have become acute. Various techniques and solutions have been proposed for solving such difficulties. For example, in the semiconductor arts, certain physical configurations of the semiconductor elements have readily lent themselves to the successful connection of leads by alloying when such alloying is carefully controlled, the tolerances within which the connecting lead wires must be positioned can be met in practical manufacturing operations. Moreover, other types of semiconductor structures readily lend themselves to the exploitation of plating techniques wherein the surfaces to which connections are to be made may be conventionally plated thereby to facilitate the subsequent connection of leads by soldering or welding. However, certain of the more desirable types of semiconductor structures are not readily susceptible of treatment with known techniques, for the problems encountered in making connections to them have involved the necessity of precisely positioning the lead wires in contact with extremely small surface areas; and such precise positioning, while not impracticable, has resulted in significantly increased cost and complexity of manufacture.

Among the semiconductor devices last mentioned are those that fall within the class defined as mesa structures. This class of devices derives its name from the fact that each contains a miniature mesa-shaped projection which protrudes from a relatively large surface. Thus, for example, in one representative type of mesa structure, one side of a semiconductor element will have a uniformly plane surface except for one relatively small projection outward therefrom, and such projection will have relatively steep sides and a flat top.

Mesa structures have been found to exhibit desirable characteristics, particularly in terms of alpha cutoff frequency, interzone capacitance, reverse bias leakage current, and switching time. However, the degree to which such desirable characteristics can be optimized depends largely upon the extent to which the mesa projections can be decreased in size; and consequently, it has been found desirable to minimize top surface areas of the mesa projections. Currently, mesh as small as 0.8 mils and less are being produced.

As might be expected, various factors tend to limit the extent to which reduction in mesa size can be advantageously exploited. Thus, for example, when the mesa top surface area is reduced in size to a point where it is substantially equal to the cross sectional area of the electrical conductor employed to make electrical connection to it, little advantage is gained from further size reduction. However, even a reduction in size to the point at which the mesa top surface area substantially equals the cross sectional area of the connecting conductor introduces the heretofore-mentioned necessity for precisely positioning the lead wire adjacent the mesa surface. Since the diameters of lead wires and mesa top surfaces in optimized structures may be less than one mil, it will be apparent that such precise positioning involves the aforementioned complexity in manufacture and increase in cost.

It is one general object of this invention to improve methods of transistor manufacture.

It is another general object of this invention to improve mesa-type transistor structures.

It is still another object of this invention to reduce cost and complexity of manufacture of mesa structures.

It is still another object of this invention to improve the reproducibility and to lessen the spread in tolerances of repetitively manufactured mesa structures.

Consequently, in accordance with one feature of the invention, the leads which are to make connection with the mesa top surfaces are positioned in contact with the semiconductor wafer before the mesas themselves are formed, thereby eliminating the necessity for precise positioning.

In accordance with yet another feature of the invention, the leads are coated with an etch-resistant substance over a predetermined length of their cylindrical surfaces beginning at (but not including) the end surfaces which are to make electrical contact with the mesa top surfaces.

In accordance with still another feature of the invention, after the coated wires are brought into contact with the semiconductor wafer surfaces, the wafers and wires are heated sufficiently to cause a small amount of the etch-protecting substance to flow, thereby to form a seal about the end of the wire where it contacts the semiconductor wafer surface.

In accordance with still a further feature of the invention, a suitable etching solution is then advantageously employed to erode portions of the semiconductor immediately adjacent the wires, whereby through the protection afforded those portions of the semiconductor which abut the lead wires, the etch is effective to cut away the desired part of the semiconductor material to leave mesas precisely positioned in abutment with the connecting leads.

These and other objects and features of the invention will be apparent from the following detailed description, by way of example, with reference to the drawings in which.

Figure 1:
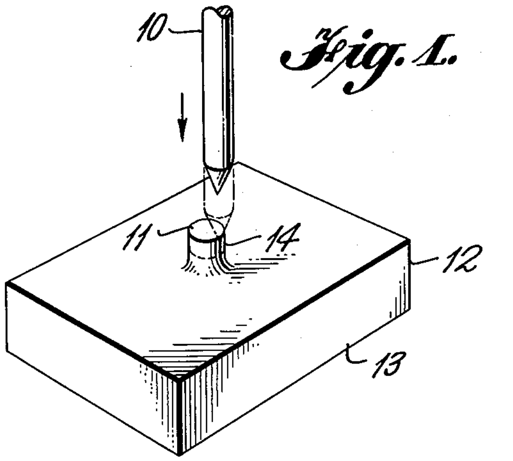
FIGURE 1 is a perspective view of a semiconductor mesa structure having a very small top surface to which a lead wire is to be attached according to prior art techniques.

Referring now to the drawings, FIGURE 1 shows a lead wire 10 which is to be attached to a very small surface 11 of a mesa structure semiconductor 12 in accordance with the prior art technique. The mesa structure 12 has been formed from a wafer of semiconductor material having a region 13 of one type of conductivity and a layer 14 of opposite conductivity type which has been diffused into the semiconductor wafer. After the diffused layer 14 is produced, the wafer is etched so that portions of the layers 14 and 13 are removed to form the mesa structure of FIGURE 1. The surface area 11 on the layer 14 which projects above the body of the wafer is quite small, preferably having a diameter no larger than 0.8 mils.

It should be pointed out that the principles of the present invention are not limited to the mesa structure configuration shown in FIGURE 1, the mesa structure of FIGURE 1 being used solely for illustrating the prior art and its attendant problems. The method of the present invention, hereinafter related, may be employed to connect leads to mesas having several diffused layers or to mesas with numerous etched away portions of various shapes and sizes. The only requirement is that a lead wire is to be attached to a very small surface area, referred to as a measa, projecting from the body of the wafer.

In FIGURE 1 the wire 10 has been illustrated as not properly aligned with the mesa surface 11. For good contact, the wire 10 must be positioned on the surface 11 in alignment with the mesa projection. It is this cumbersome and time consuming positioning and aligning operation that the present invention seeks to circumvent.

Figure 2:
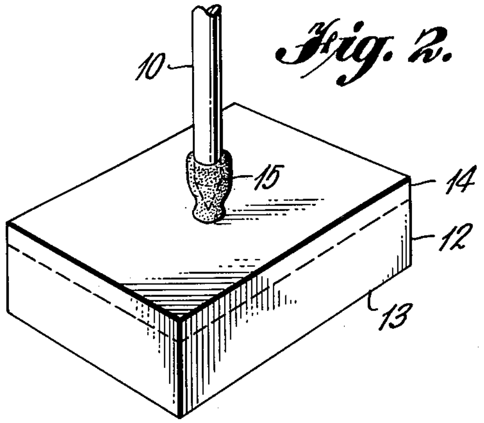
FIGURE 2 is a perspective view of a semiconductor wafer to which a lead wire is to be attached in accordance with the method of the present invention which illustrates the lead wire positioned on a diffused semiconductor wafer before the mesa is formed.

According to the technique of the invention, the end of the lead wire is positioned at any convenient spot on the wafer surface before the mesa is formed, and then the mesa is produced by etching around the area in which the wire resides on the wafer. In carrying out this technique, the end of the lead wire to be attached to a small mesa surface is first coated with a thermoplastic, high vacuum sealing wax composition. The wax is any of the asphalt base type having a melting point between about 40° C. and 150° C. Most asphalt base thermoplastic waxes would exhibit this characteristic. The end of the wax-coated wire is placed on the surface of the wafer at some convenient location, and the wafer is then heated slightly to cause the wax to melt and flow onto the wafer in the immediate area of the wire where later cooling permits the wax to adhere tightly to the semiconductor wafer. As shown in FIGURE 2, the end of the pointed lead wire 10 is to be attached to the semiconductor wafer 12, is coated with a layer 15 of asphalt base thermoplastic wax and is positioned on top of the upper surface of the diffused layer 14 of the wafer 12.

It should be appreciated that in FIGURE 2 a pointed wire was selected, though not necessarily required, to permit achievement of a small mesa. Further, it should be appreciated that the very small lead wire 10 has been placed randomly on the top surface of the very large upper layer 14 of the wafer 12, and this random contact point will be made the approximate circumferential center of the top surface of the mesa when it is formed.

Figure 3:
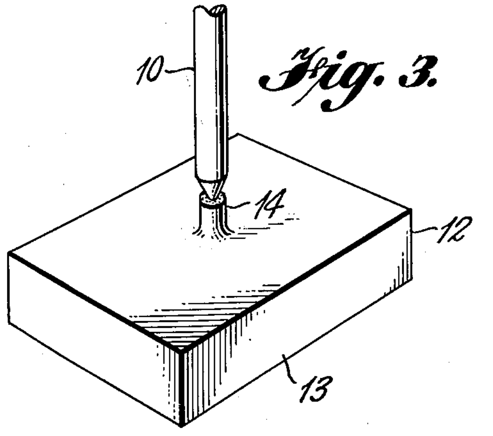
FIGURE 3 shows the semiconductor wafer of FIGURE 2 having portions etched away to form a mesa in accordance with the method of the invention, with the lead wire properly positioned on the top of the small mesa surface.

Again referring to FIGURE 2, the semiconductor wafer 12 with the lead wire 10 affixed to the wafer by the tightly-adhering, asphalt base, thermoplastic wax is now ready to etch, being protected from etching in the area of the thermoplastic wax. The wafer 12 is chemically or electrolytically etched which forms the mesa, since only that portion of the semiconductor material without the thermoplastic wax coating will be removed. As is shown in FIGURE 3, portions of the wafer 12 are removed in those area where the wax 15 does not contact the upper surface of the wafer 12, leaving a small projecting portion of the semiconductor wafer below the end of wire 10, thus forming mesa structure 12. The etching process duration is sufficiently long to remove all of the diffused layer 14 except that portion under the wire 10, as well as the other upper portions of the layer 14 coated with the wax 15. Note that the lead wire 10 is now at the approximate circumferential center of the top surface of the mesa—the remaining part of diffused layer 14. The wax 15 is then removed from the end of the wire 10 and the surface of the layer 14, the mesa, by means of a suitable solvent such as trichloroethylene, carbon tetrachloride, etc. The wire 10 is then bonded to the top surface of the mesa, which was formed out of layers 13 and 14 of wafer 12, according to conventional attachment techniques, e.g., soldering, alloying, pulsing with an electrical discharge, and passing a large current through the junction.

It should be appreciated that during the bonding operation the lead wire 10 and the surface layer 14 of wafer 12 must be maintained in immobile relationship therebetween. In the present invention described in the foregoing paragraphs, the immobile relationship is maintained by preconnecting lead wire 10 to the lead wire of a transistor or diode case, placing the wafer 12 and lead wire 10 in the desired random relation, and applying and maintaining a slight compressive force between the wafer 12 and the lead wire 10 by means of the stiffer case lead wire. Further, it should be appreciated that this holding technique could be utilized after forming of the mesa; however, it must be done prior to the wax removal. Also, it should be appreciated that any suitable jig or fixture could be utilized to maintain a slight compressive force between lead wire 10 and the surface layer 14 of wafer 12.

Thus, it will be evident that attachment of the lead wire 10 to the small mesa top surface of the mesa structure 12 may be carried out without the necessity of accurately positioning the wire 10 on top of the mesa. The size of the mesa top surface areas which can be produced by the technique of the invention is determined by the area of the lead wire contacting surface used. The mesa area can, of course, be made smaller merely by covering less of the wafer surface area with the thermoplastic wax.

It should be appreciated that the present invention is not limited to the configuration shown in FIGURES 1–3. Some other possible mesa structure configurations which can be produced by the method of this invention are given in FIGURES 4 and 5. The embodiments of these figures are merely exemplary of a few of the almost unlimited number of semiconductor mesa configurations with which the present invention is applicable.

Figure 4:
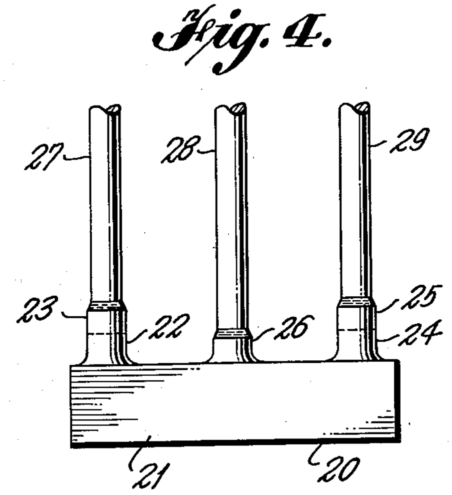
FIGURES 4 and 5 illustrate other representative configurations of mesa structures to which lead wires may be attached in accordance with the principles of the present invention.

In FIGURE 4, another embodiment of the invention, there is shown a semiconductor mesa structure 20 having a relatively large region 21 of one type of conductivity, a small projecting portion 22 at one end of the mesa structure having a diffused layer 23 of opposite conductivity type from that of the region 21, and a small projecting portion 24 at the other end of the mesa structure which possesses a diffused layer 25 of the same conductivity type as the layer 23. The region 21 also has a projecting portion 26 of very small surface area near the center of the wafer 20. Lead wires 27, 28 and 29 are attached to the outer surface of the projecting portions 22, 26 and 24 respectively by means of the technique of this invention, i.e. by first placing the leads on the wafer and then etching away the semiconductor material not underneath the leads to form the mesas.

Figure 5:
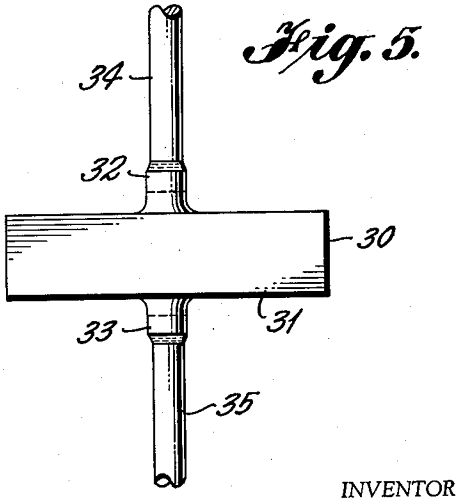

In FIGURE 5 a semiconductor mesa structure 30 is shown having a relatively large region 31 of one type of conductivity material disposed between small projecting portions which have layers 32 and 33 of opposite type of conductivity material from large region 31 diffused therein. The present invention may be used to connect a lead wire 34 to the surface of the layer 32 and lead wire 35 to the surface of the layer 33. Since the central region 31 of the mesa structure 30 is large, conventional techniques may be employed to attach a lead wire to it, and hence, no lead wire is shown attached to the region 31 in FIGURE 5.

Although the present invention has been shown and described with reference to particular embodiments, nevertheless various changes and modifications obvious to those skilled in the art are deemed to be within the spirit, scope, and contemplation of the invention.

What is claimed is:

1. A method for producing a mesa semiconductor comprising coating an end of a wire with a composition which protects semiconductor material from being etched, placing the coated end of said wire on a semiconductor element, allowing some of said composition to adhere to a portion of said semiconductor element, and etching said semiconductor element around the area where said wire resides on said semiconductor element, the said area covered by said composition being protected against etching.

2. A method for attaching a lead wire to a small surface area on a semiconductor element comprising coating an end of a lead wire with a composition which protects semiconductor material from being etched, placing the coated end of said lead wire on the semiconductor element, allowing some of said composition to adhere to a portion of said semiconductor element, etching portions of said semiconductor element, the said portion covered by said composition being protected against etching, and bonding said end of said lead wire to the protected portion of said semiconductor element.

3. A method according to claim 2 wherein said semiconductor element is of silicon.

4. A method for attaching a lead wire to a small surface area on a semiconductor element comprising coating an end of a lead wire with a composition which protects semiconductor material from being etched, placing the coated end of said lead wire on the semiconductor element, allowing some of said composition to adhere to a portion of said semiconductor element, etching portions of said semiconductor element, the said portion covered by said composition being protected against etching, removing said composition from said end of said lead wire and from said protected portion, and bonding said end of said lead wire to the protected portion of said semiconductor element.

5. A method for attaching a lead wire to a small surface area on a semiconductor element comprising coating an end of a lead wire with a composition which protects semiconductor material from being etched, placing the coated end of said lead wire on the semiconductor element, heating said semiconductor element to allow some of the said composition to flow and adhere on cooling to a portion of said semiconductor element, etching portions of said semiconductor element, the said portion covered by said composition being protected against etching, and bonding said end of said lead wire to the protected portion of said semiconductor element.

6. A method for attaching a lead wire to a small surface area on a semiconductor element comprising coating an end of a lead wire with a wax which protects semiconductor material from being etched, placing the coated end of said lead wire on the semiconductor element, allowing some of said wax to adhere to a portion of said semiconductor element, etching portions of said semiconductor element, the said portion covered by said wax being protected against etching, and bonding said end of said lead wire to the protected portion of said semiconductor element.

7. A method for attaching a lead wire to a small surface area on a semiconductor element comprising coating an end of a lead wire with a thermoplastic, asphalt base wax having a melting point between about 40° to 150° C., placing the coated end of said lead wire on the semiconductor element, heating said semiconductor element to allow some of said wax to adhere to a portion of said semiconductor element, etching portions of said semiconductor element, the said portion covered by said wax being protected against etching, removing said wax from said end of said lead wire and from said protected portion, and bonding said end of said lead wire to the protected portion of said semiconductor element.

8. A method for producing a mesa semiconductor having a projecting portion which defines a small surface area and having a lead wire attached to said small surface area, said method comprising coating an end of a lead wire with a composition which protects semiconductor material from being etched, placing the coated end of said lead wire on the semiconductor element, allowing some of said composition to adhere to a portion of said semiconductor element, etching portions of said semiconductor element to form a mesa, the said portion covered by said composition being protected against etching, and bonding said end of said lead wire to the protected portion of said semiconductor element.

9. A method for attaching a lead wire to a small surface area on a semiconductor element comprising the steps of placing a lead wire against a semiconductor element, etching portions of the semiconductor to produce a small mesa with the lead wire substantially in engagement with the top surface thereof, and bonding said lead wire to said surface area.

10. A method for producing a mesa semiconductor comprising the steps of coating an end of a lead wire with a composition which protects semiconductor material from being etched, placing the coated end of said wire on a surface of the semiconductor element, allowing some of said composition to adhere to a portion of said semiconductor element, and etching portions of the semiconductor to produce a small mesa with the lead wire substantially in engagement with the said surface area of the small mesa, the said area covered by said composition being protected against etching.

References Cited in the file of this patent

UNITED STATES PATENTS

| | | |
|---|---|---|
| 2,910,634 | Rutz | Oct. 27, 1959 |
| 2,918,719 | Armstrong | Dec. 29, 1959 |
| 2,945,286 | Dorendorf | July 19, 1960 |